United States Patent [19]

Hashemi et al.

[11] Patent Number: 5,049,979

[45] Date of Patent: Sep. 17, 1991

[54] COMBINED FLAT CAPACITOR AND TAB INTEGRATED CIRCUIT CHIP AND METHOD

[75] Inventors: Seyed H. Hashemi; David H. Carey, both of Austin, Tex.

[73] Assignee: Microelectronics and Computer Technology Corporation, Austin, Tex.

[21] Appl. No.: 539,632

[22] Filed: Jun. 18, 1990

[51] Int. Cl.⁵ .................... H01L 23/12; H01L 23/14; H01L 23/52

[52] U.S. Cl. .......................... 357/75; 357/70

[58] Field of Search ....................... 357/75, 80, 70, 74, 357/68; 361/386; 437/206, 205

[56] References Cited

U.S. PATENT DOCUMENTS

| | | |
|---|---|---|
| 375,154 | 7/1989 | Contois et al. |
| 4,249,196 | 2/1981 | Durney et al. ............ 357/74 |
| 4,288,841 | 9/1981 | Gogal ...................... 357/75 |
| 4,451,845 | 5/1984 | Philofsky et al. ......... 357/72 |
| 4,453,176 | 6/1984 | Chance et al. ............ 357/51 |
| 4,453,199 | 6/1984 | Ritchie et al. ............ 361/306 |
| 4,454,529 | 6/1984 | Philofsky et al. ......... 357/75 |
| 4,527,185 | 7/1985 | Philofsky et al. ......... 357/70 |
| 4,567,643 | 2/1986 | Droguet et al. .......... 357/80 |
| 4,598,307 | 7/1986 | Wakabayaski et al. .... 357/75 |
| 4,617,586 | 10/1986 | Cuvillers et al. ......... 357/80 |
| 4,636,918 | 1/1987 | Jodoin .................... 357/75 |
| 4,639,826 | 1/1987 | Val et al. ................. 357/80 |
| 4,654,694 | 3/1987 | Val ........................ 357/74 |
| 4,680,613 | 7/1987 | Daniels et al. ........... 357/72 |
| 4,714,952 | 12/1987 | Takekawa et al. ........ 357/75 |
| 4,744,008 | 5/1988 | Black et al. .............. 361/386 |
| 4,749,120 | 6/1988 | Hatada ................... 228/123 |
| 4,819,056 | 4/1989 | Palanisamy .............. 357/75 |
| 4,820,013 | 4/1989 | Fuse ..................... 350/96.27 |
| 4,851,862 | 7/1989 | Newman et al. ......... 346/107 |

FOREIGN PATENT DOCUMENTS

| | | |
|---|---|---|
| 0045877 | 7/1981 | European Pat. Off. . |
| 3214991 | 4/1982 | Fed. Rep. of Germany . |
| 55-91152 | 7/1980 | Japan ..................... 357/75 |
| 2096821 | 2/1982 | United Kingdom . |
| 2170047 | 1/1986 | United Kingdom . |

OTHER PUBLICATIONS

"TAB Technology Tackles High Density Interconnections", Electronic Packagig & Production, Dec. 1984, pp. 34-39.

Primary Examiner—Rolf Hille
Assistant Examiner—S. V. Clark
Attorney, Agent, or Firm—David M. Sigmond

[57] ABSTRACT

A capacitor, having an area smaller than the top area of a chip, is attached above the top of a tape-automated-bonded (TAB) chip and short bonded wires or TAB leads interconnect the capacitor electrodes with the power and ground pads on the chip. The interconnections are made as short as possible, with a maximum distance therebetween and with the greatest number which will reduce the inductance of the leads. The power and ground pads may contain inwardly extending bonding regions for wire bonds or flip chip capacitor attachment.

19 Claims, 5 Drawing Sheets

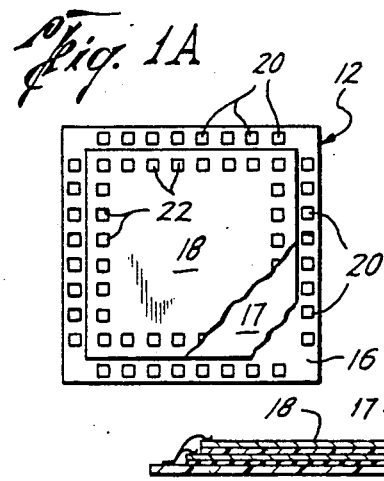
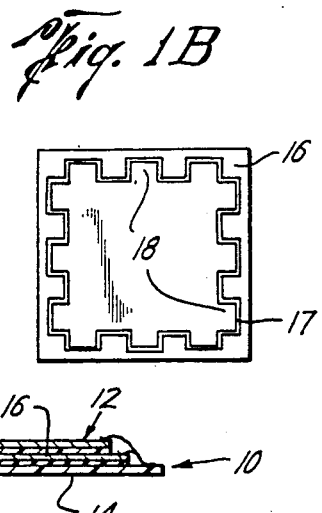
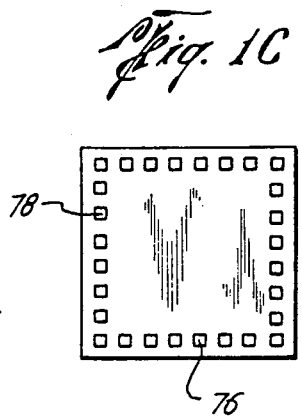
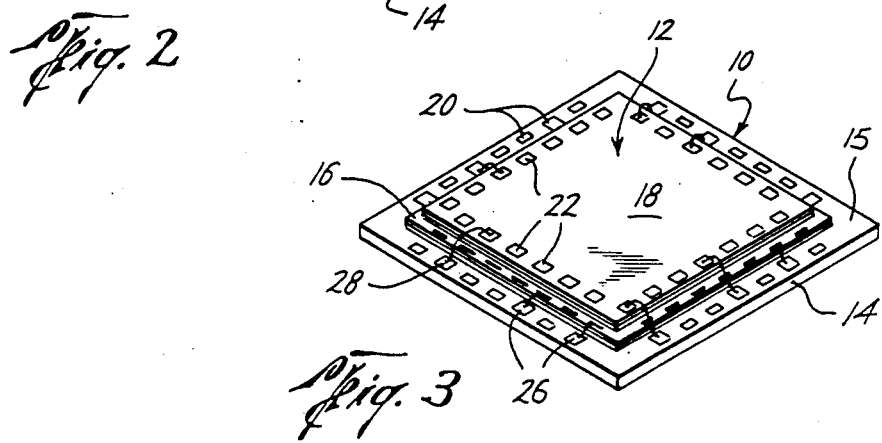
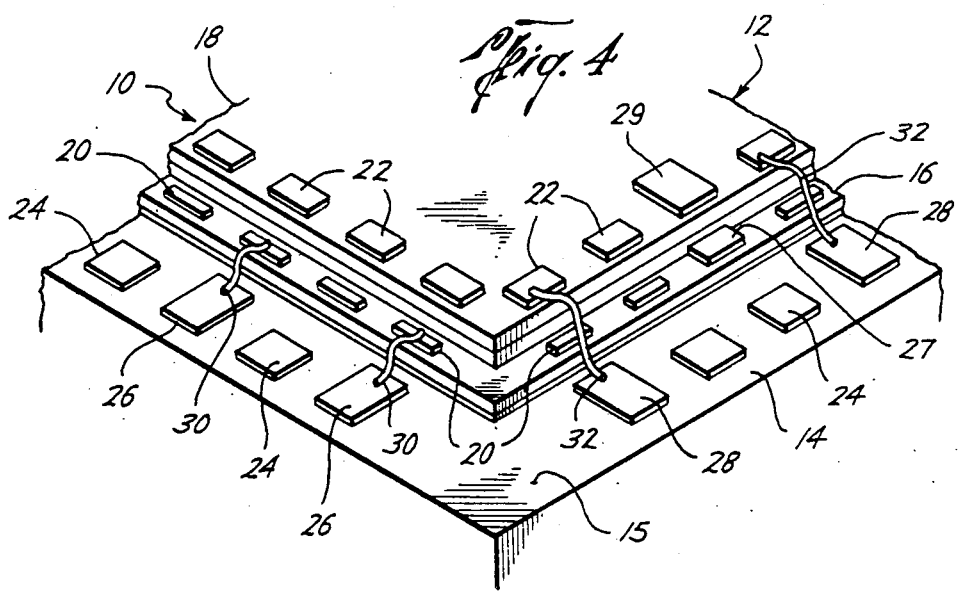

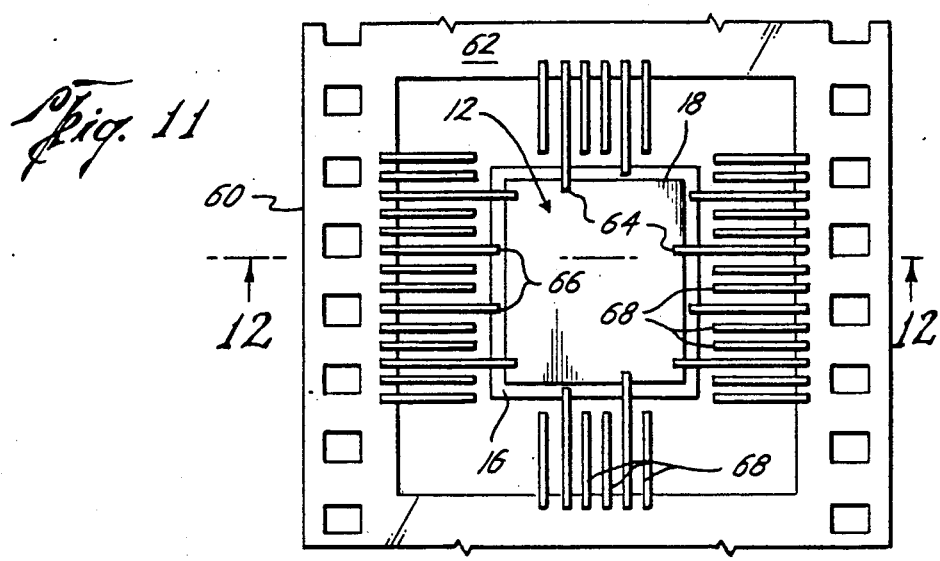
Fig. 11
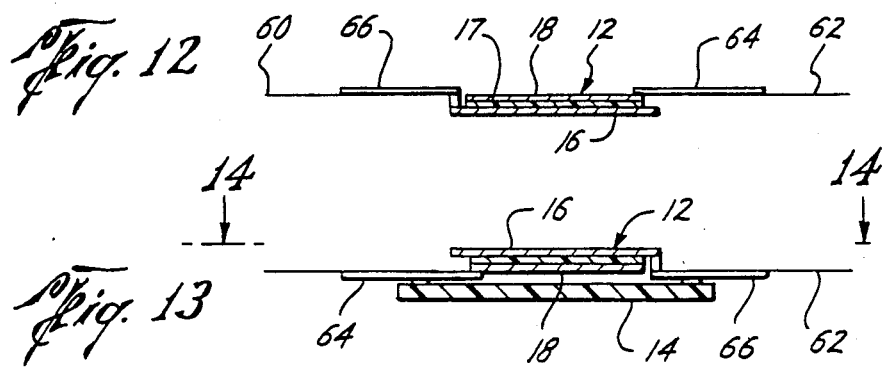
Fig. 12
Fig. 13
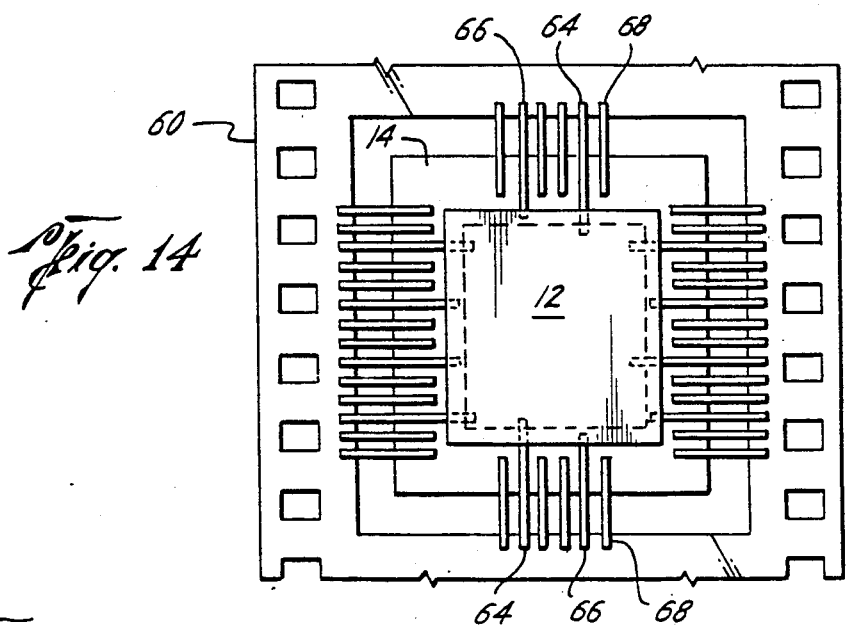
Fig. 14
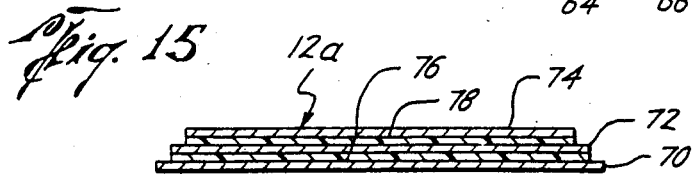
Fig. 15

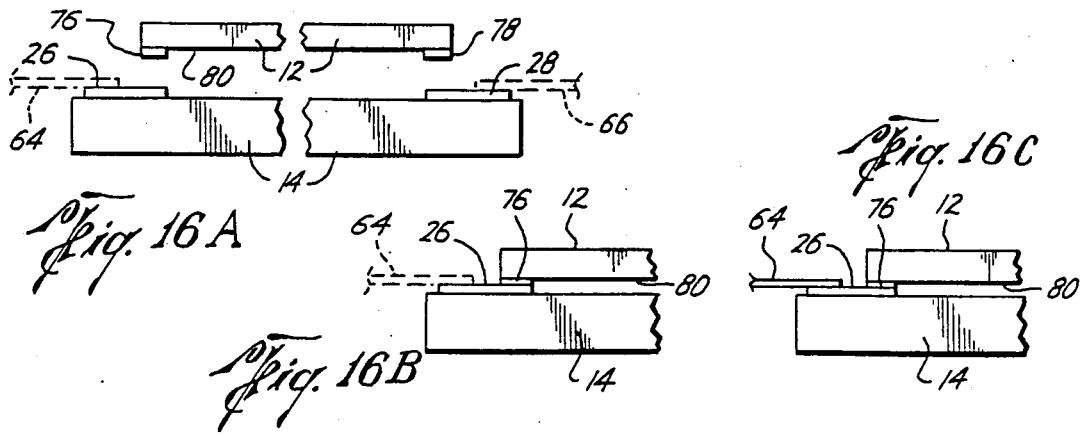
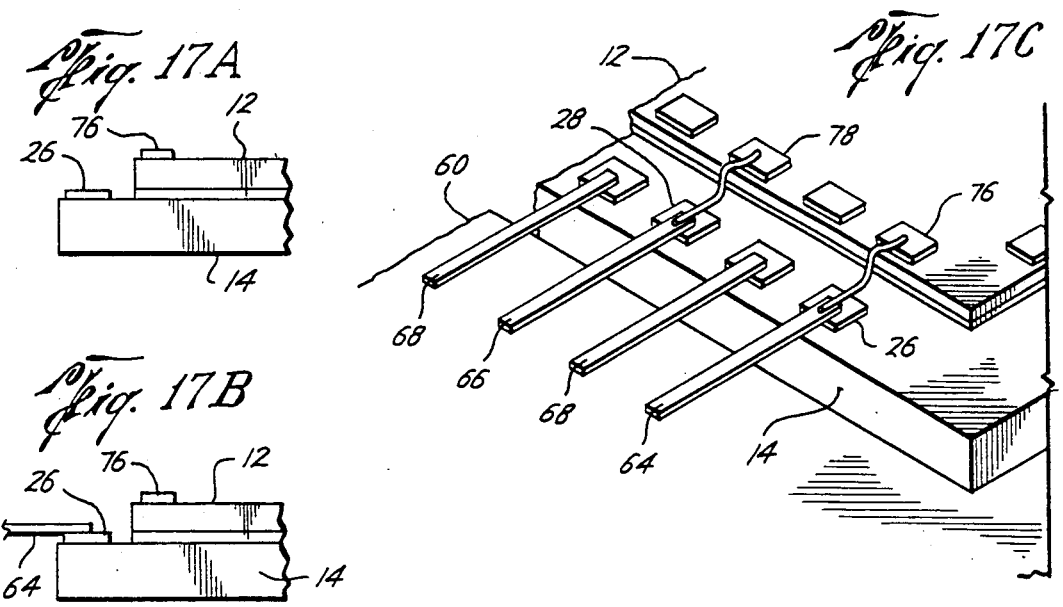
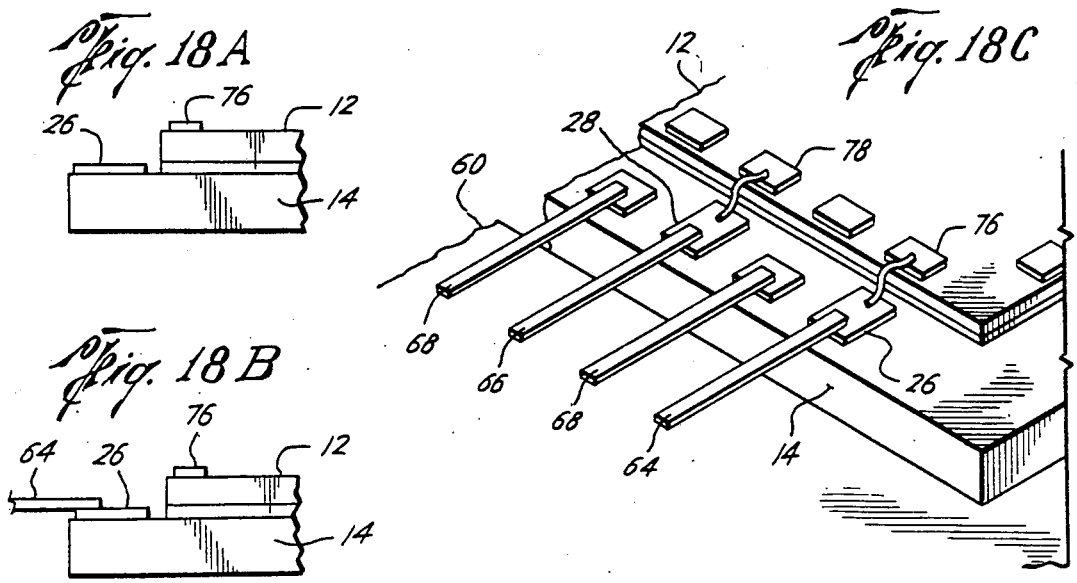

COMBINED FLAT CAPACITOR AND TAB INTEGRATED CIRCUIT CHIP AND METHOD

BACKGROUND OF THE INVENTION

The present invention relates to a bypass capacitor attached to the top of an integrated circuit chip and/or a tape-automated-bonding (TAB) tape, as well as a method of TAB manufacturing in which the capacitor electrodes are positioned adjacent to the power and ground pads on the integrated circuit chip. The use of short spaced multiple wire bonded leads between the capacitor and the chip reduce the interconnect inductance.

When a large number of circuits switch simultaneously, a current surge is generated and is accompanied by an AC voltage noise throughout a power distribution network. This phenomenon causes rise time degradation and may cause false switching of logic gates. The common practice to resolve the power disturbed noise in fast switching applications is to incorporate chip capacitors either on the single chip package or on the printed circuit board. However, there are two factors that limit the application of standard practices in high speed applications: the interconnect inductance and the capacitor self-inductance. While a larger area capacitor with thinner separation between the electrodes reduces the self-inductance of the capacitor, the length of the interconnections still remains a problem. The switching noise is linearly proportional to the magnitude of the current and inversely proportional to the signal edge rates. The inductance of the interconnect between the capacitors and the chip becomes an appreciable source of noise. The finite inductance of an interconnect, such as 0.100 inch wire bond leads plus the trace length could be high enough that make the capacitor ineffective in suppressing the switching noise.

The present invention provides a combined flat capacitor and TAB integrated circuit chip which reduces the power noise by using a bypass capacitor having an area smaller than the switching chip, thus allowing the positioning of the capacitor on top of the chip and decreasing the interconnect inductance. This can result in substantial real estate savings on high density multichip modules, for instance expensive copper/polyimide substrates in which over 50% of the surface area may be allocated to capacitors and resistors.

SUMMARY

The present invention is directed to a combined flat capacitor and TAB integrated circuit chip which includes an integrated circuit chip having a top active surface with a plurality of bonding pads including power and ground pads on the top around the outer periphery of the chip. A capacitor, having at least two electrodes and an area smaller than the top area of the chip, is attached over the top of the chip inside the bonding pads on the chip.

An object of the present invention is to provide various structures and methods for combining a flat capacitor with a chip and a TAB tape. In one embodiment the TAB tape can be bonded to the capacitor, the capacitor inverted or flipped and aligned over the chip, and the TAB leads bonded to the chip. In another embodiment the capacitor can be attached to the area inside the bonding pads on the chip, the TAB leads bonded to the chip, and the capacitor electrodes wire bonded to the TAB leads. In other embodiments the power and ground pads of the chip can have inwardly extending bonding regions and the capacitor can be attached to the area inside the bonding pads with the capacitor electrodes wire bonded to the inwardly extending regions of the pads, or alternatively the capacitor can be flip chip bonded to the inwardly extending regions of the pads.

Another object of the present invention is wherein the width and length of an upper electrode and dielectric is less than the width and length, respectively, of a lower electrode whereby bonding areas on both the upper and lower electrode are exposed.

Still another object of the present invention is wherein a top electrode is scalloped to provide a bonding surface at the edge of a lower electrode.

Yet a still further object of the present invention is wherein a plurality of separated leads connect the power and ground pads of the chip to the electrodes for reducing the inductance of the leads. Preferably, the power and ground pads on the chip are dispersed from each other for minimizing the inductance between the leads. Preferably, wire bonded leads are provided to have the shortest lengths, the greatest number, and the maximum spacing from each other, which will provide the desired minimum inductance. The leads from the ground pads may be connected to a lower electrode and the leads from the power pads connected to the upper electrode to further reduce inductance.

Yet a still further object is wherein the chip includes a clock and the delay due to switching noise transmitted from the power supply is reduced by the coaction of the capacitor.

A further object is wherein the capacitor includes at least three stacked electrodes with a dielectric between each pair of adjacent electrodes.

A still further object of the present invention is use of numerous bonding techniques, such as by flip chip, solder ball, adhesives, or amalgams.

A further object is wherein the electrodes include bonding pads for connection of the wire leads.

Yet a still further object of the present invention is the provision of a method of attaching a flat capacitor having first and second electrodes to an integrated circuit chip including aligning a TAB tape over the capacitor. The TAB tape includes a lead frame, power leads, ground leads, and signal leads. The TAB tape is aligned over the capacitor with the power leads aligned with the first electrode and the ground leads aligned with the second electrode. The power and ground leads are bonded to the capacitor and thereafter the capacitor is inverted and aligned over the top of the chip and the power leads, ground leads and signal leads are bonded to the chip.

Other objects, features and advantages will be apparent from the following description of a presently preferred embodiment of the invention, given for the purpose of disclosure and taken in conjunction with the accompanying Drawings.

BRIEF DESCRIPTION OF THE DRAWINGS

FIG. 1A is a plan view, partly in section, illustrating a bypass capacitor of the present invention wherein the width and length of the upper electrode and dielectric are less than the width and length, respectively, of the lower electrode, FIG. 1B is a plan view illustrating another bypass capacitor of the present invention wherein the upper electrode is scalloped to provide a bonding surface up to the edge of the lower electrode on the top surface of the capacitor, FIG. 1C is a plan view illustrating another bypass capacitor of the present invention wherein the electrodes are connected to power and ground pads on the top surface of the capacitor, FIG. 2 is an enlarged cross-sectional view of the combination of the capacitor and integrated circuit chip of the present invention, FIG. 3 is a perspective elevational view of the apparatus of FIG. 2, FIG. 4 is an enlarged fragmentary elevational perspective view of the apparatus of FIGS. 2 and 3, FIG. 11 is an elevational view of a preferred form of TAB tape of the present invention connected to a flat bypass capacitor, FIG. 12 is a cross-sectional view taken along the line 12—12 of FIG. 11, FIG. 13 is an elevational view, in cross-section, of the tape and capacitor of FIG. 11 inverted and attached to an integrated circuit chip, FIG. 14 is a cross-sectional view taken along the line 14—14 of FIG. 13, FIG. 15 is an elevational view, in cross-section, of a bypass capacitor having three layered electrodes.

FIG. 16A is a cross-sectional view of a capacitor inverted and aligned over the inwardly extending regions of power and ground pads on an integrated circuit, FIGS. 16B and 16C are cross-sectional views similar to FIG. 16A in which the capacitor is flip chip attached to power and ground pads on the integrated circuit, FIGS. 17A and 17B are cross-sectional views of a capacitor mounted inside the bonding pads on an integrated circuit, FIG. 17C is perspective elevational view of an integrated circuit connected to a TAB tape with a capacitor wire bonded to the TAB tape, FIGS. 18A and 18B are cross-sectional views of a capacitor mounted inside the bonding pads on an integrated circuit, and FIG. 18C is a perspective elevational view of an integrated circuit connected to a TAB tape with a capacitor wire bonded to inwardly extending regions of power and ground pads on the chip.

DESCRIPTION OF THE PREFERRED EMBODIMENTS

Figure 5:
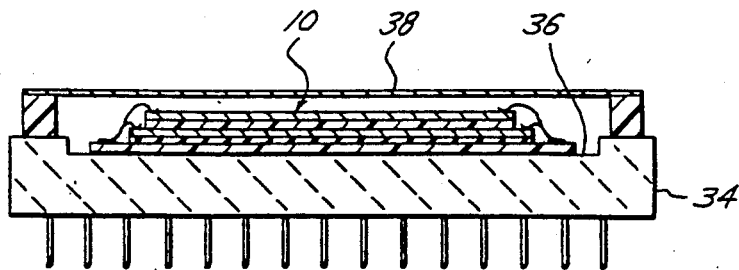
FIG. 5 is an elevational, cross-sectional view of the capacitor and integrated circuit chip of the present invention in a ceramic package.

Referring now to the drawings, and particularly to FIGS. 1-4, the reference numeral 10 generally indicates the combined flat capacitor 12 and tape-automated-bonded integrated circuit chip 14 which are closely combined for reducing the current surge and accompanied voltage noise throughout the power distribution network of the chip 14 when a large number of circuits are switched simultaneously. It is to be noted the TAB tape of the present invention is not shown in FIGS. 1-4. It is further noted that the capacitor 12 is a thin flat bypass capacitor, for instance 20 mils thick, with a surface area that is smaller than the surface area of the chip 14 and that the capacitor 12 is placed upon the top of the active surface 15. This is contrary to the conventional practice of using a larger capacitor and therefore one having a larger capacitance, but connecting to the chip from other locations. The present invention is advantageous by reducing the inductance of the connections between the capacitor 12 and the TAB chip 14 as will be more fully described hereinafter.

In addition, another advantage of attaching the capacitor 12 to the top of the chip 14 is that the location of the capacitor 12 on the top instead of on the bottom will not interfere with the attachment of a heat exchanger, if desired, to the bottom of the chip 14. In addition, attaching the capacitor 12 directly to the top surface 15 has the advantage that the number of layers in the package may be reduced. In addition, the combination of the capacitor 12 with the chip 14 can reduce the required number of input/output pins in a given package. It has been shown that a 272 pin device can be housed in a 224 pin chip carrier. Since the local power supply is integrated inside the package, there is no need to have extra power and ground pins to serve the sudden power requirement purposes. The reduced cost due to the lesser number of pins and lack of need to route and place decoupling capacitors on the exterior of the package is another advantage of the present invention.

The capacitor 12 includes a lower electrode 16, an upper electrode 18, and a dielectric 17 therebetween. Numerous structures and layouts for capacitor 12 are suitable. As seen in FIG. 1A, the width and length of the top electrode 18 and the dielectric 17 can be less than the width and length of the lower electrode 16 in order to provide an easily and closely accessible bonding area on the lower electrode 16. Alternatively, as seen in FIG. 1B the top electrode 18 could be in scalloped form to provide a bonding surface at the edge of the lower electrode 16. Or alternatively as seen in FIG. 1C, electrodes 16 and 18 can be connected to power electrode pads 76 and ground electrode pads 78 on the top surface of capacitor 12. For illustration purposes only, the multilevel capacitor of FIG. 1A will used in for FIGS. 2-15, whereas the power/ground electrode pads capacitor of FIG. 1C will be used in FIGS. 16-18. Returning to the capacitor of FIG. 1A, the lower electrode 16 includes a plurality of bonding pads 20 around its outer periphery, and the upper electrode 18 includes a plurality of bonding pads 22 around its outer periphery. In addition, the integrated circuit chip 14 includes a plurality of bonding pads such as signal pads 24 and pads 26 and 28, one of which may be the power pads and the other of which may be the ground pads. The pads 26 and 28 may have a greater bonding area than signal pads 24, such as by extending inwardly toward the capacitor 12 further than the signal pads 24. Likewise, capacitor 12 can include pads 27 on the lower electrode 16 and/or pads 29 on the upper electrode 18 which have a greater bonding area than bonding pads 20, such as by extending inwardly. Larger pads 26, 28 on chip 14 and 27, 29 on capacitor 12 may be useful, for instance, as power or ground pads to bond to multiple connections or to flip chip bond, with the capacitor electrodes or with TAB leads from a package or substrate. The outer periphery of the capacitor 12 and thus the pads 20 and 22 are positioned closely adjacent to the pads 26 and 28 for reducing the length of the wire bonded wires shown as leads 30 and 32, respectively. The leads 30 are connected by being bonded by any suitable method, such as single point thermosonic wire bonding, thermal compression bonding, adhesives, amalgams, laser TAB bonding (see U.S. Pat. No. 4,845,335) or laser bonding between the pads 26 on the chip 14 and the pads 20 on the electrode 16 of the capacitor 12. Similarly, the leads 32 may be bonded between the pads 28 on the chip 14 and the pads 22 on the electrode 18 of the capacitor 12.

It is important to reduce the inductance of the leads 30 and 32 as much as possible. Therefore, it is important to position the outer periphery of the capacitor 12 as close as possible to the pads 26 and 28 on the chip 14, such as for example, within 10 mils. By placing the capacitor 12 on top of the chip 14, the inductance of the leads 30 and 32 can be drastically reduced, thereby allowing a smaller capacitor 12 to be used as a bypass capacitor for the chip 14. Examples of conventional interconnection lengths between a capacitor and the power and ground pads of a chip depend on the type of package. In single chip packages typically capacitors are placed on the package body and routed through vias and metal traces in the package as well as the wire or TAB bond which results in interconnect lengths beyond 100 mils. In multichip packages the relatively short vias and metal traces result in interconnect lengths approximately the length of the wire or TAB bond, usually 50-75 mils. Using the present combination, the length of the leads 30 and 32 may be made approximately 20 to 30 mils thereby decreasing the inductance of the leads. It is to be noted that the leads 30 to the lower electrode 16 are shown as shorter than the leads 32 to the upper electrode 18, although in other capacitor designs such as the scalloped form shown in FIG. 1B leads 30 and 32 would have the same length. Additionally, the inductance of the leads can be minimized by providing a greater number of leads 30 and 32 for reducing the inductance. That is, it is desirable to provide leads 30 and 32 having the shortest length, the maximum spread between the leads, and the greatest number of leads to provide the minimum inductance. However, these factors are interdependent. That is, increasing the number of leads lowers the inductance, but placing them closer together increases their mutual inductance. Therefore, the factor of length spacing and number should be optimized. Maximum spacing between power leads and maximum spacing between ground leads with power/ground lead pairs as close as possible is preferred. Inductance may be further reduced by connecting the lower electrode to ground.

Any suitable flat capacitor may be utilized and connected to the top of the chip 14 by suitable means such as epoxy, for example; Amicon 211 nonconductive epoxy or DuPont 3400 thermoplastic nonconductive reworkable film. For example only, the capacitor 12 can be made using a conventional thin film process, a thick film process, or a laminated process. In a thin film process, a silicon substrate with a thickness less than or equal to 0.010 inches with a thin $SiO_2$ insulating layer may be used. The bottom electrode 16 may be made of tantalum and copper and chrome, which is deposited on top of the $SiO_2$. A dielectric sandwich 17 of tantalum pentoxide and silicon dioxide with a total thickness of less than 80 micro-inches is deposited on the bottom electrode 16. A titanium tungsten top electrode 18 is then plated on top of the dielectric 17. The exposed surfaces of the bottom electrode 16 and the top surface of the top electrode 18 are plated with gold to furnish a suitable bonding surface. The bond pads 20 and 22 may be five micrometers thick aluminum pads or 25 micrometers thick gold bumps. In a thick film process a 10 mil thick alumina substrate can be coated with a layer of gold paste for bottom electrode 16, a high dielectric ceramic for dielectric 17, and another layer of gold paste for upper electrode 18. Capacitors made by the laminated process may have copper electrodes 16 and 18 5 mils thick and a 5 mil thick dielectric whose material has high frequency properties such as X7R $BaTiO_3$. The bonding surfaces may be gold plated 60 microinches thick to provide a surface suitable for bonding. Sandwiching 60 microinches of nickel between the gold and the copper to prevent diffusion is preferred. Or gold pads 20 and 22 can be used.

Various other types of capacitors 12 may be utilized. Aluminum bonding pads and gold bumps can be replaced by gold bonding rails on the upper and lower electrodes to provide power/ground bonding surfaces, for example. Bonding rails may advantageously provide a wider access to bond sites than individual bonding pads.

Referring to FIG. 5, in the case of using a ceramic package 34 with a chip cavity 36, the thickness of the chip cavity or the bonding shelves height that provide a stand-off tolerance for the seal lid 38 can be adjusted in order to accommodate the increased thickness of the modified chip and capacitor assembly 10.

Figure 6:
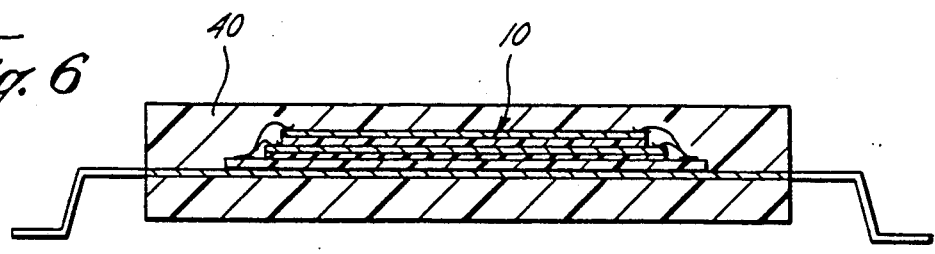
FIG. 6 is an elevational view, in cross-section, of the capacitor and integrated circuit chip of the present invention encapsulated in a plastic package.

Referring to FIG. 6, the present invention 10 can be encapsulated in a plastic package 40. However, the overall thickness of the plastic material over the integrated chip and capacitor should be adjusted to avoid thermo-mechanical stress.

Figure 7:
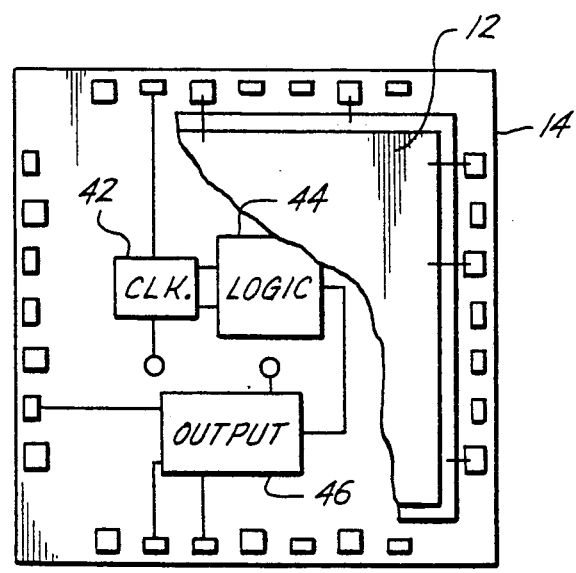
FIG. 7 is an elevational view, partly in cross-section, illustrating the connection of the capacitor to an integrated circuit chip having a clock.
Figure 8:
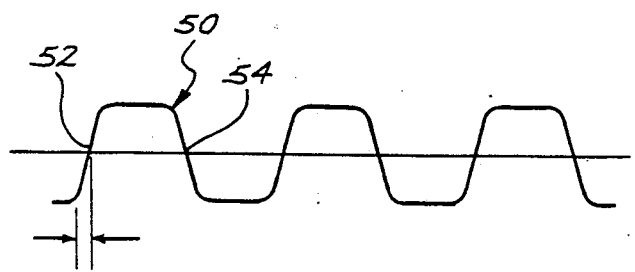
FIG. 8 is a graph of the output signals of the clock of FIG. 7.

Integrated circuits that have switching noise are subject to time delays that must be accounted for. This becomes particularly important in integrated circuits having clocks as it requires an increase in dead time to be accounted for thereby slowing the overall operation of the chip. Referring now to FIG. 7, an integrated circuit chip 14 is shown having a clock 42 connected to logic 44 and an output 46. That is, the overall cycle time can be adversely affected by the switching noise. Referring now to FIG. 8, a graph 50 shows the timing cycle for the clock 42 of FIG. 7 having a rising edge 52 and a trailing edge 54.

Figure 9:
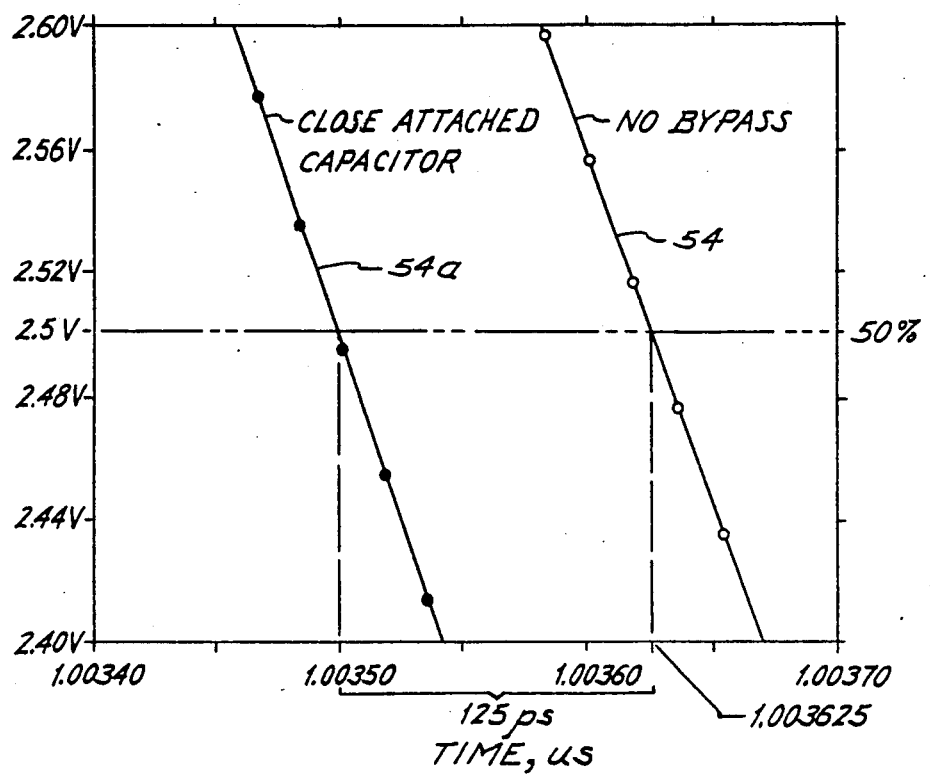
FIG. 9 is a graph illustrating the difference in delay time of the trailing edge of the clock output with and without the bypass capacitor.
Figure 10:
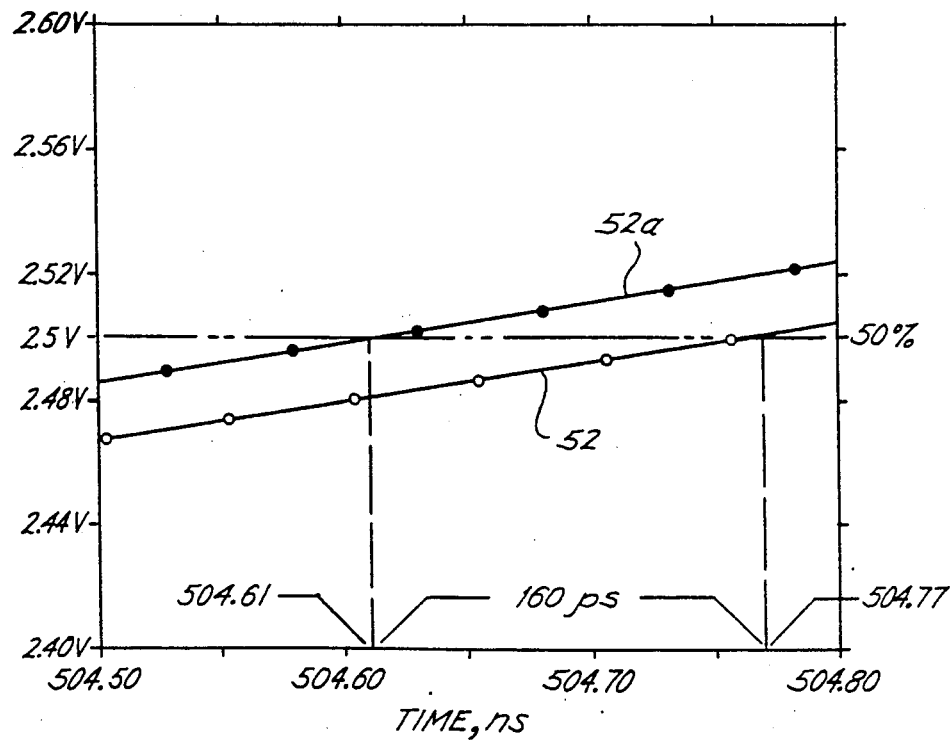
FIG. 10 is a graph illustrating the difference in delay time of the rising edge of the clock output with and without a bypass capacitor.

Referring now to FIG. 9, the difference between a portion of the trailing edge 54 without the bypass capacitor 12 is compared with a portion of the trailing edge 54a with the bypass capacitor 12 is shown. It is noted that the difference in the waves at the 50% point on the graphs is 125 ps. Similarly, referring to FIG. 10, the difference in the portion of the rising edge 52 without the capacitor and the rising edge 52a with the addition of the bypass capacitor 12 provides a time difference of 160 ps at the 50% point. The graphs in FIGS. 9 and 10 thereby show that the overall cycle time of a clock cycle can be decreased by the use of the bypass capacitor 12 of the present invention.

It is pointed out that any technical matters in conjunction with the close-attached flat capacitor 12 and chip 14 as previously described in FIGS. 1–10 can be equally applied to the following four embodiments of the present invention insofar as the same is applicable, and the same description is not repeated.

FIRST EMBODIMENT

The chip 14 is TAB bonded, for instance with gold plated copper leads, the wire bonds 30 and 32 could go from the capacitor 12 to the TAB leads. Referring now to FIGS. 11–14, a specific method is shown of attaching a capacitor 12 to an integrated circuit chip 14 by the use of tape-automated-bonding (TAB) tape. Referring to FIG. 11, a TAB tape, generally indicated by the reference numeral 60, is shown having a lead frame 62, a plurality of power leads 64, a plurality of ground leads 66, and a plurality of signal leads 68. Power leads 64 and ground leads 66 are preferably the same length, but both are longer than signal leads 68. However, if a scalloped form capacitor as seen in FIG. 1B were used then the power leads 64 and ground leads 66 would have the same length. As shown in FIGS. 11 and 12, the TAB tape 60 is aligned over the capacitor 12 with the power leads 64 aligned with a first electrode, such as electrode 18 and the ground leads 66 aligned with the second electrode, such as electrode 16. The power leads 64 and ground leads 66 are bonded to the electrodes 18 and 16, respectively, of the capacitor 12. The TAB lead frame 62 now serves as a carrier for the capacitor 12.

Thereafter, the lead frame 62 is inverted, as best seen in FIG. 13, and as best seen in FIG. 14, the leads 64, 66 and 68 are aligned with and bonded to the integrated circuit chip 14. In this embodiment pads 26 and 28 need not extend inwardly.

While the capacitor 12 has been described as having two electrodes, a capacitor 12a, as best seen in FIG. 15, may be provided having additional electrodes. For example, the capacitor 12a has a first electrode 70, a second electrode 72, and a third electrode 74 separated by dielectrics 76 and 78, respectively, with the lower electrodes 70 and 72 having bonding areas extending outwardly. Such a three-electrode capacitor 12a would be advantageous in providing a bypass capacitor for a chip having multiple voltage supplies, such as 3.3 and 5 volt supplies. That is, electrodes 70 and 72 could be connected to the power and ground pads for a first electrical supply system and electrodes 72 and 74 could be connected to a second set of ground pads and power pads of a second different electrical supply system.

SECOND EMBODIMENT

In accordance with the present invention, additional structures and methods can be used to combine capacitor 12 and TAB chip 14. As best seen in FIGS. 16A–16C, capacitor 12 is inverted with power electrode pad 76 and ground electrode pad 78 on surface 80 aligned and in contact with the inward regions of inwardly extending power pad 26 and ground pad 28, respectively, on chip 14. Thereafter capacitor 12 and chip 14 can be bonded by a solder reflow technique. TAB power lead 64 and ground lead 66 are bonded to power pad 26 and ground pad 28, respectively, either before or after capacitor 12 is flip chip bonded to chip 14.

THIRD EMBODIMENT

Referring now to FIGS. 17A–17C, TAB tape 60 with power leads 64, ground leads 66, and signal leads 68 is bonded to chip 14. Thereafter, power electrode pads 76 and ground electrode pads 78 on capacitor 12 are wire bonded to power leads 64 and ground leads 66, respectively. In this embodiment pads 26 and 28 need not extend inwardly.

FOURTH EMBODIMENT

Referring now to FIGS. 18A–18C, TAB tape 60 with power leads 64, ground leads 66, and signal leads 68 is bonded to the non-inwardly extending regions of pads 26 and 28, and also power electrode pads 76 and ground electrode pads 78 on capacitor 12 are wire bonded to the inwardly extending regions of pads 26 and 28, respectively, either before or after TAB tape 60 is bonded to chip 14.

The present invention, therefore, is well adapted to carry out the objects and attain the ends and advantages mentioned as well as others inherent therein. While presently preferred embodiments of the invention have been given for the purpose of disclosure, numerous changes in the details of construction and steps of the process, will be readily apparent to those skilled in the art and which are encompassed within the spirit of the invention and the scope of the appended claims.

What is claimed is:

1. A combined flat capacitor and TAB integrated circuit chip, comprising:
   an integrated circuit chip having a top active surface with a plurality of bonding pads including power and ground pads on the top around the outer periphery of the chip, wherein the bonding pads are bonded to TAB leads, and
   a flat capacitor, having first and second electrodes and a dielectric therebetween with the first electrode connected to a capacitor power pad on the top surface of the capacitor and the second electrode connected to a capacitor ground pad on the top surface of the capacitor, and having an area smaller than the top area of the chip, inverted with the capacitor power pad and capacitor ground pad aligned with and bonded to the TAB leads connected to power and ground pads on the chip, thereby providing a close-attached capacitor which reduces switching noise in the chip.

2. A combined flat capacitor and TAB integrated circuit chip, comprising:
   an integrated circuit chip having a top active surface with a plurality of bonding pads including power and ground pads on the top around the outer periphery of the chip, wherein the power and ground pads have enlarged bonding regions extending inwardly, and wherein the bonding pads are bonded to TAB leads, and
   a flat capacitor, having first and second electrodes and a dielectric therebetween with the first electrode connected to a capacitor power pad on the top surface of the capacitor and the second electrode connected to a capacitor ground pad on the top surface of the capacitor, and having an area smaller than the top area of the chip, attached to the top of the chip inside the bonding pads, wherein wire bonds from the capacitor power pad and capacitor ground pad are connected to the inwardly extending regions of the power and ground pads on the chip, thereby providing a close-attached capacitor which reduces switching noise in the chip.

3. A combined flat capacitor and TAB integrated circuit chip, comprising:

an integrated circuit chip having a top active surface with a plurality of bonding pads including power and ground pads on the top around the outer periphery of the chip, wherein the power and ground pads have enlarged bonding regions extending inwardly, and wherein the bonding pads are bonded to TAB leads, and a flat capacitor, having first and second electrodes and a dielectric therebetween with the first electrode connected to a capacitor power pad on the top surface of the capacitor and the second electrode connected to a capacitor ground pad on the top surface of the capacitor, and having an area smaller than the top area of the chip, inverted with the capacitor power pad and capacitor ground pad aligned with and bonded to the inwardly extending regions of the power and ground pads on the chip, thereby providing a close-attached capacitor which reduces switching noise in the chip.

4. A method of attaching a flat capacitor having first and second electrodes and a dielectric therebetween to an integrated circuit chip, comprising the steps of:

aligning a TAB tape, having a lead frame, power leads, ground leads and signal leads, in which the power and ground leads are longer than the signal leads, over a first side of a flat capacitor with the power leads aligned with the first electrode, and the ground leads aligned with the second electrode, bonding the power and ground leads to the electrodes, inverting the capacitor, aligning the inverted capacitor with leads bonded to the electrodes over the top of the chip, and bonding the power leads, ground leads, and signal leads to the chip, thereby providing a close-attached capacitor which reduces switching noise in the chip.

5. The method of claim 4, wherein the chip has a top active surface with a plurality of bonding pads including power and ground pads on the top around the outer periphery of the chip, and wherein the capacitor has an area smaller than the top area of the chip and is attached to the top of the TAB leads inside the bonding pads on the chip.

6. The method of claim 5 wherein the power and ground leads are of different lengths.

7. A method of attaching a flat capacitor having first and second electrodes and a dielectric therebetween to an integrated circuit chip having a top active surface area with a plurality of bonding pads including power and ground pads on the top around the outer periphery of the chip, comprising the steps of:

attaching the flat capacitor having an area smaller than the area inside the bonding pads on the chip to the area inside the bonding pads, wherein the attachment is provided by a reworkable material, aligning a TAB tape, having a lead frame, power leads, ground leads and signal leads, over the bonding pads on top of the chip, bonding the power leads, ground leads, and signal leads to the pads on the chip, and bonding the power and ground leads to the first and second electrodes, thereby providing a close-attached capacitor which reduces switching noise in the chip.

8. The method of claim 7 wherein the power and ground pads have enlarged bonding regions extending inwardly and the electrodes are wire bonded to the inwardly extending regions of the power and ground pads on the chip.

9. A method of attaching a flat capacitor having first and second electrodes and a dielectric therebetween to an integrated circuit chip having a top active surface area with a plurality of bonding pads including power and ground pads on the top around the outer periphery of the chip, comprising the steps of:

attaching the flat capacitor having an area smaller than the area inside the bonding pads on the chip to the area inside the bonding pads, wherein the attachment is provided by a reworkable material, aligning a TAB tape, having a lead frame, power leads, ground leads and signal leads, over the bonding pads on top of the chip, bonding the power leads, ground leads, and signal leads to the pads on the chip, and bonding the power and ground leads to the first and second electrodes, thereby providing a close-attached capacitor which reduces switching noise in the chip.

10. The method of claim 7 wherein the first and second electrodes are wire bonded to the power and ground leads.

11. A method of attaching a flat capacitor having first and second electrodes and a dielectric therebetween to an integrated circuit chip having a top active surface area with a plurality of bonding pads, including power and ground pads with enlarged regions extending inwardly, on the top around the outer periphery of the chip, comprising the steps of:

inverting and aligning the flat capacitor having an area smaller than the area inside the bonding pads on the chip to the area inside the bonding pads so that the electrodes are aligned with the inwardly extending regions of the power and ground pads, aligning a TAB tape, having a lead frame, power leads, ground leads and signal leads, over the bonding pads on top of the chip, bonding the power leads, ground leads, and signal leads to the pads on the chip, and bonding the power and ground pads to the first and second electrodes, thereby providing a close-attached capacitor which reduces switching noise in the chip.

12. A combined flat capacitor and TAB integrated circuit chip, comprising:

an integrated circuit chip having a top active surface with a plurality of bonding pads including power and ground pads on the top around the outer periphery of the chip, wherein the bonding pads are bonded to TAB leads, and a flat capacitor, having first and second electrodes and a dielectric therebetween and having an area smaller than the top area of the chip, attached to the top of the chip inside the bonding pads, wherein the first electrode is connected to a capacitor power pad on the top surface of the flat capacitor, the second electrode is connected to a capacitor ground pad on the top surface of the flat capacitor, a first wire bond from the capacitor power pad is connected to a first TAB lead bonded to a power pad of the chip, and a second wire bond from the capacitor ground pad is connected to a second TAB lead bonded to a ground pad of the chip, thereby providing a close-attached capacitor which reduces switching noise in the chip.

13. A combined flat capacitor and TAB integrated circuit chip, comprising:
- an integrated circuit chip having a top active surface with a plurality of bonding pads including power and ground pads on the top around the outer periphery of the chip, wherein the bonding pads are bonded to TAB leads, and
- a flat capacitor, having first and second electrodes and a dielectric therebetween and having an area smaller than the top area of the chip, attached to the top of the chip inside the bonding pads, wherein wire bonds from the first and second electrodes are connected to the TAB leads bonded to the power and ground pads of the chip, and wherein the wire bonded leads are provided to have the shortest lengths, the greatest number, and the maximum spacing from each other which will provide the desired minimum inductance, thereby providing a close-attached capacitor which reduces switching noise in the chip.

14. A combined flat capacitor and TAB integrated circuit chip, comprising:
- an integrated circuit chip having a top active surface with a plurality of bonding pads including power and ground pads on the top around the outer periphery of the chip, wherein the bonding pads are bonded to TAB leads, and
- a flat capacitor, having first and second electrodes and a dielectric therebetween and having an area smaller than the top area of the chip, inverted with the electrodes aligned with and bonded to the TAB leads connected to power and ground pads on the chip, wherein the TAB leads are provided to have the shortest lengths, the greatest number, and the maximum spacing from each other to provide the desired minimum inductance, thereby providing a close-attached capacitor which reduces switching noise in the chip.

15. A combined flat capacitor and TAB integrated circuit chip, comprising:
- an integrated circuit chip having a top active surface with a plurality of bonding pads including power and ground pads on the top around the outer periphery of the chip, wherein the power and ground pads have enlarged bonding regions extending inwardly, and wherein the bonding pads are bonded to TAB leads, and
- a flat capacitor, having first and second electrodes and a dielectric therebetween and having an area smaller than the top area of the chip, attached to the top of the chip inside the bonding pads, wherein wire bonds from the first and second electrodes are connected to the inwardly extending regions of the power and ground pads on the chip, and wherein the wire bonds are provided to have the shortest lengths, the greatest number, and the maximum spacing from each other to provide the desired minimum inductance, thereby providing a close-attached capacitor which reduces switching noise in the chip.

16. The method of claim 7, wherein the reworkable material is an epoxy.

17. The method of claim 7, wherein the reworkable material is a thermoplastic.

18. The method of claim 9, wherein the reworkable material is an epoxy.

19. The method of claim 9, wherein the reworkable material is a thermoplastic.

* * * * *